US007818655B1

(12) United States Patent
Lee et al.

(10) Patent No.: US 7,818,655 B1
(45) Date of Patent: Oct. 19, 2010

(54) METHOD FOR QUANTITATIVE DETECTION OF MULTIPLE ELECTROMIGRATION FAILURE MODES

(75) Inventors: Eun-Joo Lee, Cupertino, CA (US); Christine Hau-Riege, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1188 days.

(21) Appl. No.: 11/437,484

(22) Filed: May 19, 2006

(51) Int. Cl.
    *G08C 25/00* (2006.01)
(52) U.S. Cl. ...................................... 714/799; 438/468
(58) Field of Classification Search ................. 714/799; 438/468
    See application file for complete search history.

(56) References Cited

U.S. PATENT DOCUMENTS 5,889,789 A * 3/1999 Sanada ...................... 714/745

2002/0017906 A1 * 2/2002 Ho et al. ..................... 324/526

* cited by examiner

Primary Examiner—Scott T Baderman
Assistant Examiner—Enam Ahmed
(74) Attorney, Agent, or Firm—Farjami & Farjami LLP

(57) ABSTRACT

According to one exemplary embodiment, a computer implemented method for detecting multiple failure modes in a set of electromigration failure data points includes sorting the data points by time to failure and dividing the data points to form first and second groups of data points to determine a first combination of first and second seed groups of data points providing an initial highest weighted R-square. The method further includes defining an intermediate group of data points shared between the first and second seed groups of data points and grouping the intermediate group of data points with the first and second seed groups of data points to determine a second combination of the first and second seed groups of data points providing a final highest weighted R-square. The initial highest weighted R-square is then compared to the final highest weighted R-square.

20 Claims, 5 Drawing Sheets

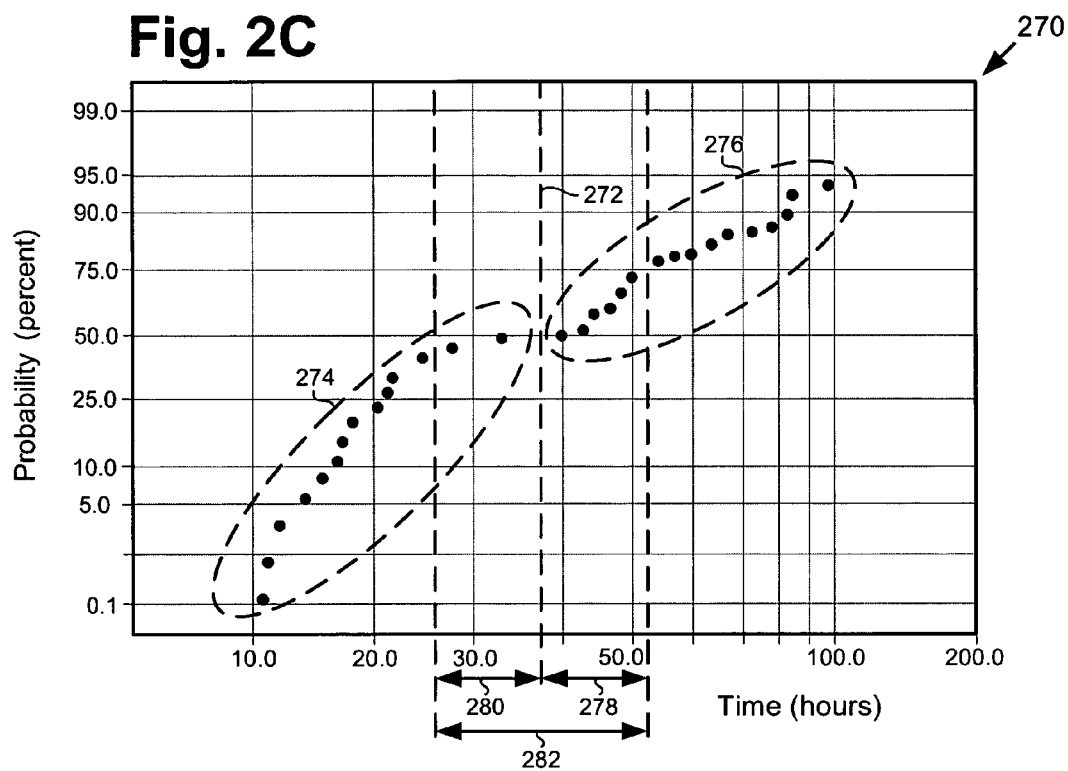

METHOD FOR QUANTITATIVE DETECTION OF MULTIPLE ELECTROMIGRATION FAILURE MODES

TECHNICAL FIELD

The present invention relates generally to the field of semiconductor devices. More particularly, the present invention addresses electromigration failure modes in semiconductor devices.

BACKGROUND ART

An electromigration failure data set can include a number of electromigration failure data points, which typically indicate a probability of failure and a time to failure. A number of known failure modes, i.e., types of electromigration failures, can exist within an electromigration failure data set and each data point can be associated with a single failure mode. However, the association between each data point and each failure mode existing in the electromigration failure data set is typically unknown when the electromigration failure data set is acquired.

One conventional method for associating each data point to each failure mode includes determining a single log-normal distribution fit for all of the data points associated with multiple failure modes. The single log-normal distribution fit is determined by grouping the data points into a number of groups equal to the number of known failures and determining a log-normal distribution fit for each group of data points. Each log-normal distribution fit is then weighted based on a probability of all data points to determine a single log-normal distribution fit. However, since the single log-normal distribution fit is based on a probability of all data points and consequently all failure modes, the association between each data point and each failure mode made using the conventional method may be inaccurate.

Accordingly, there exists a strong need in the art for a method that can accurately determine the association between each data point in an electromigration failure data set and each failure mode therein.

SUMMARY

The present invention addresses and resolves the need in the art for a method for quantitative detection of multiple electromigration failure modes in an electromigration failure data set.

According to one exemplary embodiment, a computer implemented method for detecting multiple failure modes in a set of electromigration failure data points includes sorting the data points by time to failure. The method further includes determining an overall log-normal distribution fit for the data points and determining an overall R-square for the data points. The method further includes dividing the data points to form first and second groups of data points where each of the first and second groups of data points includes at least three data points. The method further includes determining first and second log-normal distribution fits for respective first and second groups of data points and determining first and second R-squares for respective first and second groups of data points. The method further includes determining a weighted R-square for the data points using the first and second R-squares.

According to this exemplary embodiment, the method further includes dividing the data points to form all possible combinations of the first and second groups of data points and determining first and second log-normal distribution fits for all possible combinations of respective first and second groups of data points. The method further includes determining first and second R-squares for all possible combinations of respective first and second groups of data points and determining a plurality of weighted R-squares for the data points using the first and second R-squares, where the highest weighted R-square of the plurality of weighted R-squares defines an initial highest weighted R-square. The combination of first and second groups of data points providing the initial highest weighted R-square defines a first combination of respective first and second seed groups of data points.

According to this exemplary embodiment, the method further includes determining first and second log-normal distribution fits for respective first and second seed groups of data points and defining an intermediate group of data points shared between the first and second seed groups of data points by determining data points within a desired percentile of the first and second log-normal distribution fits and including the data points within the desired percentile in the intermediate group of data points. For example, the desired percentile can be between 10.0% and 30.0%. The method further includes determining first and second R-squares for respective first and second seed groups of data points by including each point in the intermediate group of data points in either the first or second seed groups of data points and determining a weighted R-square for all data points using the first and second R-squares.

According to this exemplary embodiment, the method further includes grouping the intermediate group of data points with the first and second seed groups of data points to form all possible combinations of the first and second seed groups of data points and determining first and second log-normal distribution fits for all possible combinations of respective first and second seed groups of data points. The method further includes determining first and second R-squares for all possible combinations of respective first and second seed groups of data points and determining a plurality of weighted R-squares for the data points using the first and second R-squares, where a highest weighted R-square in the plurality of weighted R-squares defines a final highest weighted R-square. The combination of first and second seed groups of data points providing a final highest weighted R-square defines a second combination of respective first and second seed groups of data points.

According to this exemplary embodiment, the method further includes comparing the initial highest weighted R-square to the final highest weighted R-square, where the second combination of first and second seed groups of data points and the intermediate group of data points defines respective first and second failure modes if the final highest weighted R-square is greater than the initial highest weighted R-square.

Other features and advantages of the present invention will become more readily apparent to those of ordinary skill in the art after reviewing the following detailed description and accompanying drawings.

BRIEF DESCRIPTION OF THE DRAWINGS

FIG. 2C depicts an exemplary scatter plot including exemplary first and second seed groups of data points in the set of thirty data points shown in FIG. 2A.

DETAILED DESCRIPTION OF THE INVENTION

The present invention is directed to a method for quantitative detection of multiple electromigration failure modes in an electromigration failure data set. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1A:
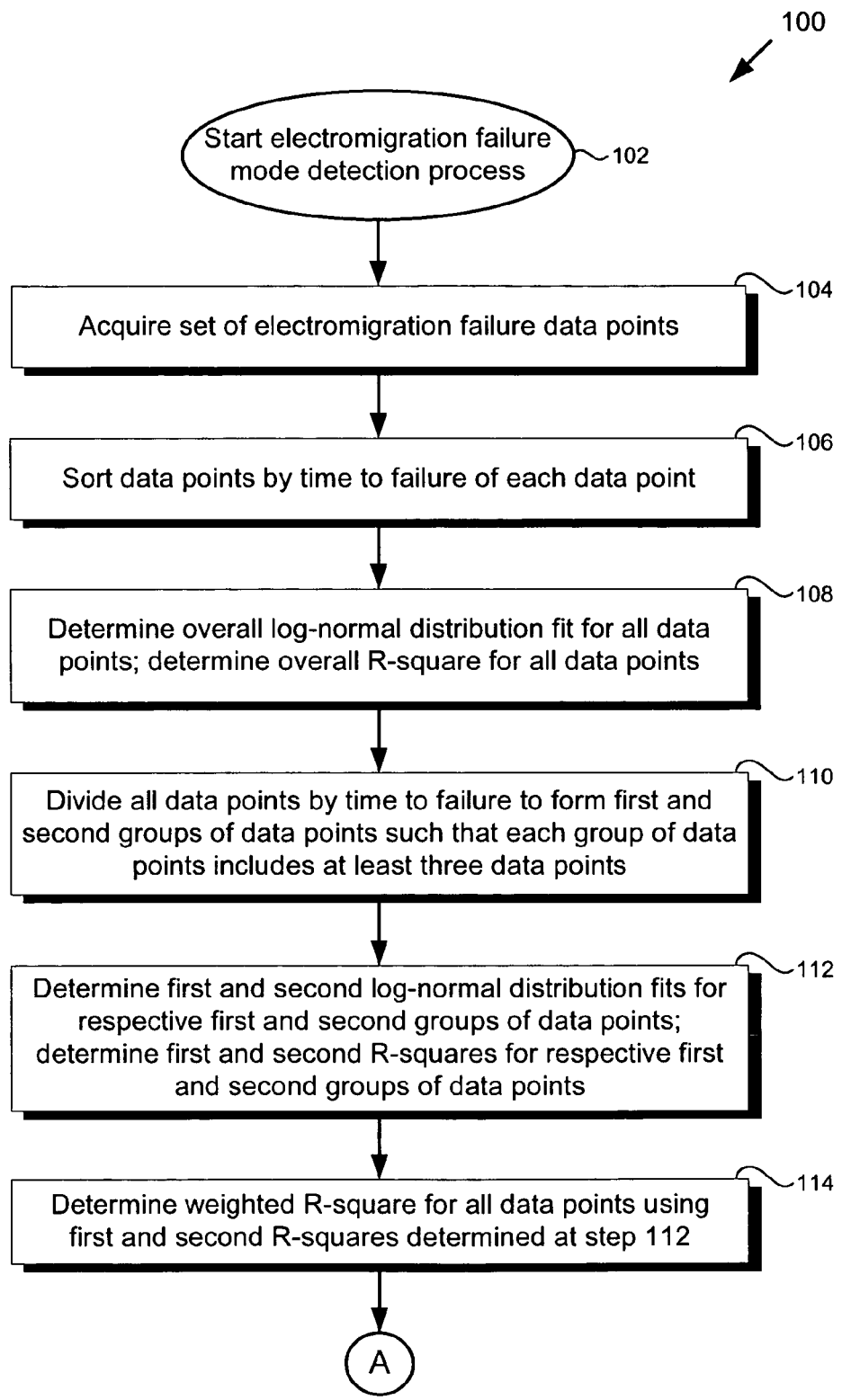
FIG. 1A depicts a flow chart showing the steps taken to implement an embodiment of the present invention.
Figure 1B:
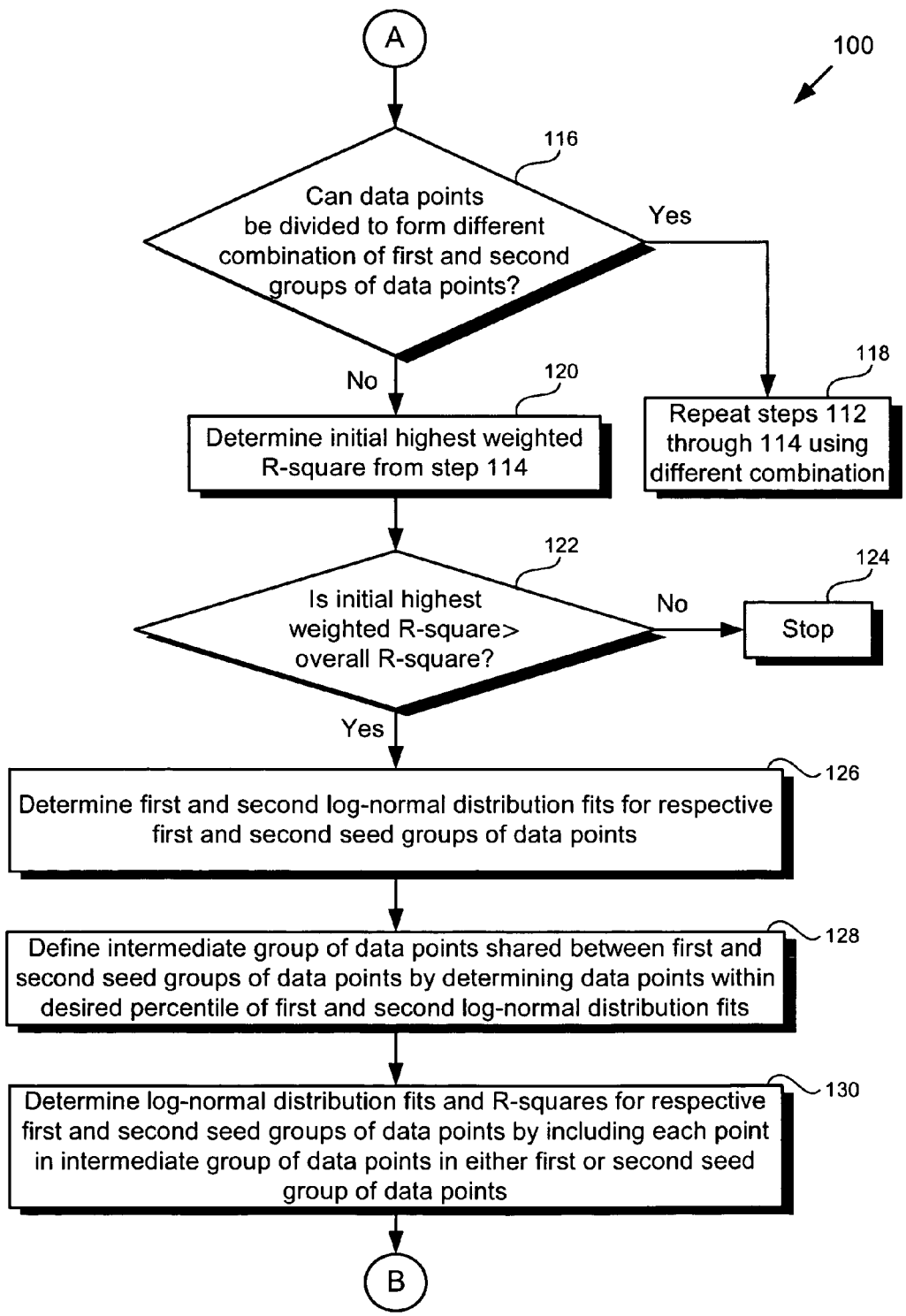
FIG. 1B is a continuation of the flowchart in FIG. 1A.
Figure 1C:
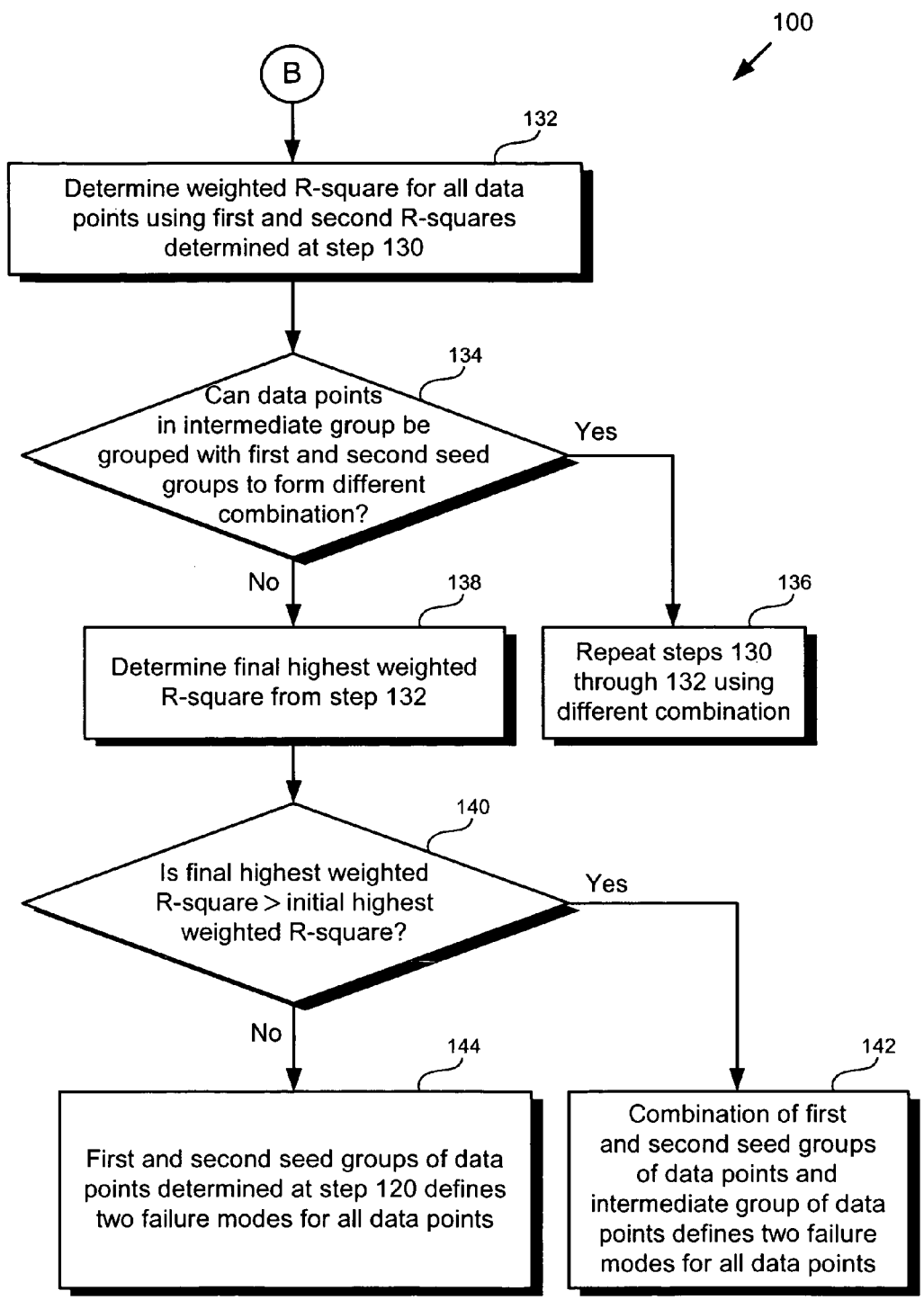
FIG. 1C is a continuation of the flowchart in FIG. 1B.

FIGS. 1A, 1B, and 1C illustrate flowchart 100 for performing an electromigration failure mode detection process in accordance with one embodiment of the present invention. As shown in FIG. 1A, at step 102 of flowchart 100, the electromigration failure mode detection process starts. At step 104, a set of electromigration failure data points is accumulated from an electromigration test, where each data point specifies a probability of failure and a time to failure. The set of electromigration failure data points can include multiple known failure modes, i.e., failure types, however the relationship between each data point and each failure mode is unknown.

Figure 2A:
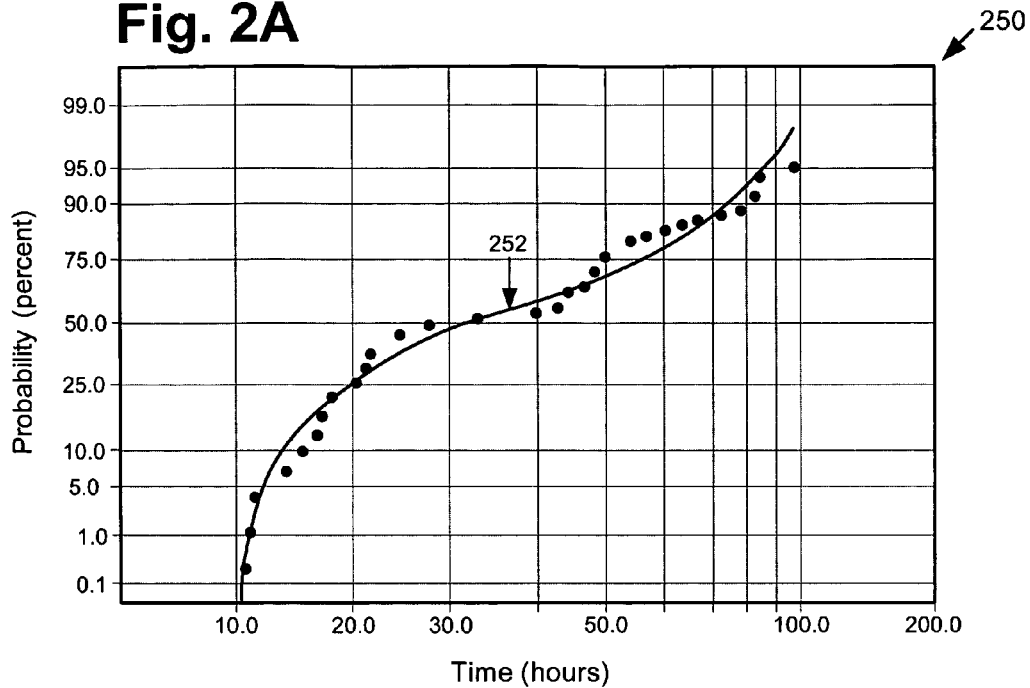
FIG. 2A depicts an exemplary scatter plot including an exemplary set of electromigration failure data points and an exemplary log-normal distribution fit in accordance with one embodiment of the present invention.

At step 106, the data points are sorted by the time to failure specified by each data point. For example, as shown in plot 250 of FIG. 2A, an exemplary set of thirty electromigration failure data points can be sorted according to increasing time to failure and plotted on a scatter plot, where the x-axis of the scatter plot represents time to failure and where the y-axis represents probability of failure. At step 108, an overall log-normal distribution fit for all of the sorted data points, such as overall log-normal distribution fit 252 in FIG. 2A, is determined using the least square method. The overall log-normal distribution fit is then used to determine an overall R-square for all of the sorted data points.

Figure 2B:
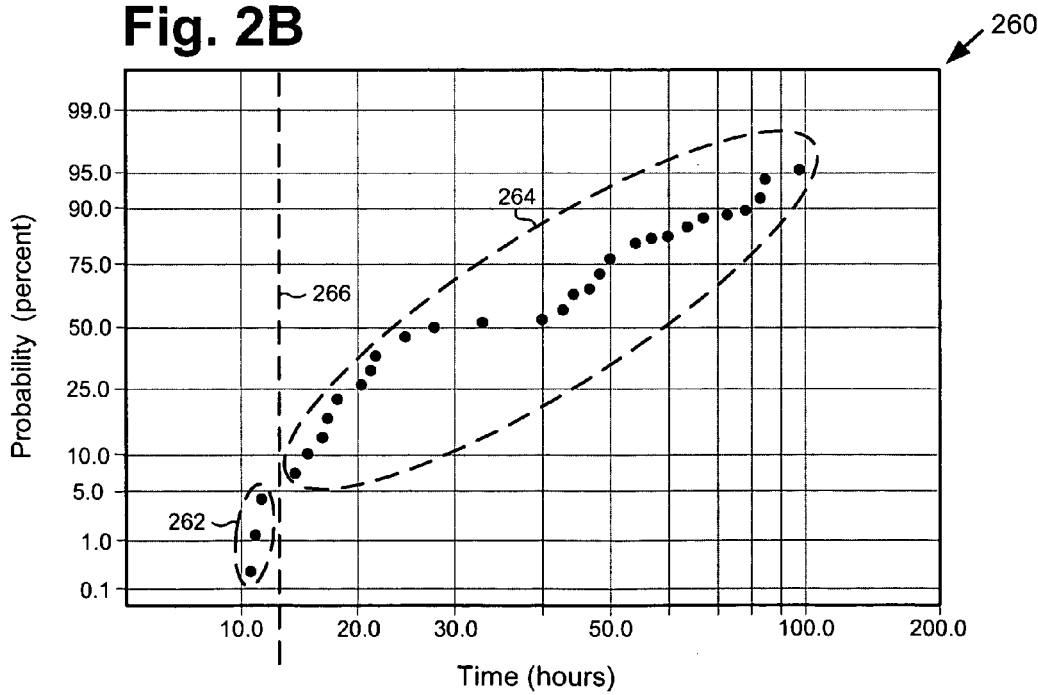
FIG. 2B depicts an exemplary scatter plot including an exemplary division of the set of thirty data points shown in FIG. 2A.

At step 110, the sorted data points are divided by time to failure to form two exclusive groups of data points including a first group of data points and a second group of data points, where the time to failure of each data point in the first group of data points is less than the time to failure of each data point in the second group of data points. In another embodiment including more than two failure modes, the sorted data points can be grouped to form a number of exclusive groups equal to the number of known failure modes. The first and second groups of data points must each include at least three data points. Plot 260 of FIG. 2B, for example, which corresponds to plot 250 of FIG. 2A, shows an exemplary division of the set of thirty data points shown in plot 250 of FIG. 2A. In plot 260, dividing line 266 defines a first and second group of data points, where the first group of data points includes the data points in region 262 and where the second group of data points includes the data points in region 264.

At step 112, a first log-normal distribution fit for the first group of data points and a second log-normal distribution fit for the second group of data points is determined using the least square method. First and second R-squares are then determined for respective first and second groups of data points. At step 114, a weighted R-square is determined for all of the sorted data points using the first and second R-squares determined at step 112 using the equation:

$$(n_1*R_1+n_2*R_2)/(n_1+n_2) \qquad \text{(equation 1)}$$

where "$n_1$" represents the number of data points in the first group of data points, "$n_2$" represents the number of data points in the second group of data points, "$R_1$" represents the first R-square for the first group of data points, and where "$R_2$" represents the second R-square for the second group of data points. In plot 260 shown in FIG. 2B, for example, "$n_1$" for the first group of data points (e.g., data points in region 262) equals three while "$n_2$" for the second group of data points (e.g., data points in region 264) equals 27.

At decision step 116 in FIG. 1B, it is determined whether all of the sorted data points can be divided to form a different combination of first and second groups of data points. For example, in plot 260 of FIG. 2B, dividing line 266 can be situated such that the first group of data points includes four data points (i.e., where "$n_1$" equals four) and the second group of data points includes 26 data points (i.e., where "$n_2$" equals 26). Thus, the number of possible combinations of first and second groups of data points that can be formed for a given set of data points, where each group of data points includes at least three data points, can be determined using the equation:

$$\text{Number of possible combinations}=(N-5) \qquad \text{(equation 2)}$$

where "N" is a positive integer that represents the total number of data points in the set of data points. For example, in plot 260 in FIG. 2B, the number of possible combinations of first and second groups of data points equals 25, since there a total of 30 data points (e.g., Number of possible combinations=30−5). Therefore, if a different combination of first and second groups of data points is possible, steps 112 through 114 are repeated using the different combination of first and second groups of data points. Otherwise, at step 120, the highest weighted R-square from step 114 is determined. The highest weighted R-square at step 120 defines the initial highest weighted R-square.

At decision step 122, it is determined whether the initial highest weighted R-square determined in step 120 is greater than the overall R-square determined in step 108. If the initial highest weighted R-square is greater than the overall R-square, then the combination of first and second groups of data points providing the initial highest weighted R-square defines the first seed group of data points and the second seed group of data points, respectively. Otherwise, at step 124, a single failure mode is detected and the process is stopped.

At step 126, first and second log-normal distribution fits are determined for respective first and second seed groups of data points. For example, in plot 270 in FIG. 2C, which corresponds to plot 260 in FIG. 2B, dividing line 272 defines the first and second seed groups of data points (i.e., the combination of first and second groups of data points providing the initial highest weighted R-square), where the first seed group of data points includes the data points in region 274 and where the second seed group of data points includes the data points in region 276. Therefore, at step 126, a first lognormal distribution fit is determined for the first seed group of data points (i.e., data points in region 274) in plot 270 of FIG. 2C and a second lognormal distribution fit is determined for the second seed group of data points (i.e., data points in region 276) in plot 270 of FIG. 2C.

At step 128, an intermediate group of data points that are shared between the first and second seed groups of data points is defined. The intermediate group of data points can be defined by determining the data points within a desired percentile of the highest probability of the first log-normal distribution fit for the first seed group of data points and within a desired percentile of the lowest probability of the second log-normal distribution fit for the second seed group of data points. The desired percentile, for example, can be within a range of 10.0% to 30.0%. For example, in plot 270 of FIG. 2C, intermediate region 282 is defined by determining the data points having the highest 20.0% probability of the first log-normal distribution fit (e.g., data points within interval 280) and the data points having the lowest 20.0% probability of the second log-normal distribution fit (e.g., data points within interval 278).

At step 130, each data point within the intermediate group of data points defined in step 128 is grouped exclusively with either the first seed group of data points or the second seed group of data points. A log-normal distribution fit and an R-square is then determined for each first and second seed groups of data points that include data points in the intermediate group of data points. Referring now to FIG. 1C, at step 132, a weighted R-square is determined for all of the data points using equation 1 and the respective R-squares for the first and second seed groups of data points determined at step 130.

At decision step 134, it is determined whether the data points in the intermediate group of data points can be grouped with the first and second seed groups of data points to form a different combination of first and second seed groups of data points. The data points within the intermediate group of data points are not required to be grouped with the first and second seed groups of data points in sequence of time (i.e., by time to failure). In other words, the possible number of combinations of first and second seed groups of data points and the data points within the intermediate group of data points is represented by the equation:

$$\text{Possible number of seed group combinations} = 2^x \quad \text{(equation 3)}$$

where "x" is a positive integer representing the number of data points in the intermediate group of data points. For example, in plot 270 of FIG. 2C, since the intermediate group of data points (e.g., data points within interval 282) includes eight data points, the possible number of combinations of first and second seed groups of data points is 256 (e.g., possible number of seed group combinations=$2^8$=256). Therefore, if a different combination of first and second seed groups of data points is possible at decision step 134, then at step 136, steps 130 through 132 are repeated using the different combination of first and second seed groups of data points. Otherwise, at step 138, if all of the possible combinations of first and second seed groups of data points have been formed, the highest weighted R-square from step 132 is determined. The highest weighted R-square from step 132 defines the final highest weighted R-square.

At decision step 140, it is determined whether the final highest weighted R-square determined at step 138 (i.e., final highest weighted R-square from a combination of first and second seed groups of data points and intermediate group of data points) is greater than the initial highest weighted R-square for the first and second seed groups of data points determined at step 120. If the final highest weighted R-square determined at step 138 is greater, then at step 142, the combination of first and second seed groups of data points that includes the data points in the intermediate group of data points providing the final highest weighted R-square defines the two failure modes for all of the data points. Otherwise, the first and second seed groups of data points determined at step 120 defines the two failure modes for all of the data points.

Therefore, the present invention provides a method for quantitatively detecting multiple failure modes in an electromigration failure data set by using independent lognormal distribution fits for each independent group of data points associated with each failure mode. As such, the present invention advantageously avoids using data points and parameters associated with one failure mode to estimate another failure mode as done in conventional methods, thus providing failure mode detection with increased accuracy.

The present invention also provides more accurate failure mode detection using a substantially smaller number of data points than conventional methods. For example, the present invention can be used with a data set that includes only 30 data points, while conventional methods would typically require 250 or more data points. Consequently, the present invention can operate faster than conventional methods.

Furthermore, the present invention reduces costs by reducing the amount of testing required, since the present invention can use a smaller number of data points than are required by conventional methods.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for quantitative detection of multiple electromigration failure modes in an electromigration failure data set has been described.

The invention claimed is:

1. A computer implemented method for detecting multiple failure modes in a set of electromigration failure data points, said method comprising steps of:
    sorting said data points by time to failure;
    dividing said data points to form first and second groups of data points to determine a first combination of first and second seed groups of data points providing an initial highest weighted R-square;
    defusing an intermediate group of data points shared between said first and second seed groups of data points;
    grouping said intermediate group of data points with said first and second seed groups of data points to determine a second combination of said first and second seed groups of data points providing a final highest weighted R-square;
    comparing said initial highest weighted R-square to said final highest weighted R-square.

2. The method of claim 1 further comprising the steps of:
    determining an overall log-normal distribution fit for said data points; and
    determining an overall R-square for said data points.

3. The method of claim 1 wherein each of said first and second groups of data points includes at least three data points.

4. The method of claim 3 further comprising the steps of:
 determining first and second log-normal distribution fits for respective said first and second groups of data points;
 determining first and second R-squares for respective first and second groups of data points; and
 determining a weighted R-square for said data points using said first and second R-squares.

5. The method of claim 4 further comprising the steps of:
 dividing said data points to form all possible combinations of said first and second groups of data points;
 determining first and second log-normal distribution fits for said all possible combinations of respective said first and second groups of data points;
 determining first and second R-squares for said all possible combinations of respective said first and second groups of data points; and
 determining a plurality of weighted R-squares for said data points using said first and second R-squares, wherein a highest weighted R-square of said plurality of weighted R-squares defines an initial highest weighted R-square.

6. The method of claim 5 wherein a combination of first and second groups of data points providing said initial highest weighted R-square defines a first combination of respective first and second seed groups of data points.

7. The method of claim 6 further comprising the steps of:
 determining first and second log-normal distribution fits for respective first and second seed groups of data points;
 determining data points within a desired percentile of said first and second log-normal distribution fits and including said data points within said desired percentile in said intermediate group of data points;
 determining first and second R-squares for respective first and second seed groups of data points by including each point in said intermediate group of data points in either said first or second seed groups of data points.
 determining a weighted R-square for all data points using said first and second R-squares.

8. The method of claim 7 further comprising the steps of:
 grouping said intermediate group of data points with said first and second seed groups of data points to form all possible combinations of said first and second seed groups of data points;
 determining first and second log-normal distribution fits for said all possible combinations of respective said first and second seed groups of data points;
 determining first and second R-squares for said all possible combinations of respective said first and second seed groups of data points; and
 determining a plurality of weighted R-squares for said data points using said first and second R-squares, wherein a highest weighted R-square in said plurality of weighted R-squares defines a final highest weighted R-square.

9. The method of claim 8 wherein said second combination of first and second seed groups of data points and said intermediate group of data points defines respective first and second failure modes if said final highest weighted R-square is greater than said initial highest weighted R-square.

10. The method of claim 7 wherein said desired percentile is between 10.0% and 30.0%.

11. A computer implemented method for detecting multiple failure modes in a set of electromigration failure data points, said method comprising steps of:
 sorting said data points by time to failure;
 determining an overall log-normal distribution fit for said data points;
 determining an overall R-square for said data points;
 dividing said data points to form first and second groups of data points to determine a first combination of first and second seed groups of data points providing an initial highest weighted R-square;
 defining an intermediate group of data points shared between said first and second seed groups of data points;
 grouping said intermediate group of data points with said first and second seed groups of data points to determine a second combination of said first and second seed groups of data points providing a final highest weighted R-square;
 comparing said initial highest weighted R-square to said final highest weighted R-square.

12. The method of claim 11 wherein each of said first and second groups of data points includes at least three data points.

13. The method of claim 12 further comprising the steps of:
 determining first and second log-normal distribution fits for respective said first and second groups of data points;
 determining first and second R-squares for respective first and second groups of data points; and
 determining a weighted R-square for said data points using said first and second R-squares.

14. The method of claim 13 wherein said weighted R-square is defined by:

$$\text{Weighted } R\text{-square} = (n_1 * R_1 + n_2 * R_2)/(n_1 + n_2).$$

15. The method of claim 13 further comprising the steps of:
 dividing said data points to form all possible combinations of said first and second groups of data points;
 determining first and second log-normal distribution fits for said all possible combinations of respective said first and second groups of data points;
 determining first and second R-squares for said all possible combinations of respective said first and second groups of data points; and
 determining a plurality of weighted R-squares for said data points using said first and second R-squares, wherein a highest weighted R-square in said plurality of weighted R-squares defines an initial highest weighted R-square.

16. The method of claim 15 wherein a combination of first and second groups of data points providing said initial highest weighted R-square defines respective first and second seed groups of data points.

17. The method of claim 16 further comprising the steps of:
 determining first and second log-normal distribution fits for respective first and second seed groups of data points;
 determining data points within a desired percentile of said first and second log-normal distribution fits and including said data points within said desired percentile in said intermediate group of data points;
 determining first and second R-squares for respective first and second seed groups of data points by including each point in said intermediate group of data points in either said first or second seed groups of data points;
 determining a weighted R-square for all data points using said first and second R-squares.

18. The method of claim 17 further comprising the steps of:
 grouping said intermediate group of data points with said first and second seed groups of data points to form all possible combinations of said first and second seed groups of data points;

determining first and second log-normal distribution fits for said all possible combinations of respective said first and second seed groups of data points;

determining first and second R-squares for said all possible combinations of respective said first and second seed groups of data points; and determining a plurality of weighted R-squares for said data points using said first and second R-squares, wherein a highest weighted R-square in said plurality of weighted R-squares defines a final highest weighted R-square.

19. The method of claim 18 wherein said second combination of first and second seed groups of data points and said intermediate group of data points defines respective first and second failure modes if said final highest weighted R-square is greater than said initial highest weighted R-square.

20. The method of claim 19 wherein said desired percentile is between 10.0% and 30.0%.

* * * * *